United States Patent
Otsuka et al.

(10) Patent No.: US 6,961,230 B2
(45) Date of Patent: Nov. 1, 2005

(54) CAPACITOR, CAPACITOR EQUIPPED SEMICONDUCTOR DEVICE ASSEMBLY, CAPACITOR EQUIPPED CIRCUIT SUBSTRATE ASSEMBLY AND ELECTRONIC UNIT INCLUDING SEMICONDUCTOR DEVICE, CAPACITOR AND CIRCUIT SUBSTRATE

(75) Inventors: Jun Otsuka, Aichi (JP); Manabu Sato, Nagoya (JP); Yukihiro Kimura, Nagoya (JP)

(73) Assignee: NGK Spark Plug Co., Ltd., Aichi (JP)

( * ) Notice: Subject to any disclaimer, the term of this patent is extended or adjusted under 35 U.S.C. 154(b) by 137 days.

(21) Appl. No.: 10/862,562

(22) Filed: Jun. 8, 2004

(65) Prior Publication Data

US 2004/0257749 A1 Dec. 23, 2004

(30) Foreign Application Priority Data

Jun. 20, 2003 (JP) ........................................ 2003-176967

(51) Int. Cl.⁷ .............................................. H01G 4/228
(52) U.S. Cl. ................................ 361/306.2; 361/306.3; 361/312; 361/313; 361/321.1; 361/321.2
(58) Field of Search ........................... 361/306.2, 306.3, 361/321.1, 321.2, 302, 303, 311, 312, 313, 328, 320, 321.5, 301.2, 301.4

(56) References Cited

U.S. PATENT DOCUMENTS

| | | | |
|---|---|---|---|
| 6,034,864 A | 3/2000 | Naito et al. | |
| 6,259,593 B1 * | 7/2001 | Moriwaki et al. | 361/303 |
| 6,282,079 B1 * | 8/2001 | Nagakari et al. | 361/303 |
| 6,351,369 B1 * | 2/2002 | Kuroda et al. | 361/306.3 |
| 6,370,011 B1 | 4/2002 | Naito et al. | |
| 6,462,932 B1 | 10/2002 | Naito et al. | |
| 6,496,354 B2 | 12/2002 | Naito et al. | |
| 6,549,395 B1 | 4/2003 | Naito et al. | |
| 6,577,490 B2 * | 6/2003 | Ogawa et al. | 361/306.1 |
| 6,606,237 B1 * | 8/2003 | Naito et al. | 361/306.3 |
| 2002/0109958 A1 | 8/2002 | Naito et al. | |

FOREIGN PATENT DOCUMENTS

| | | |
|---|---|---|
| EP | 1 041 631 A2 | 4/2000 |
| JP | 11-204372 A | 7/1999 |
| JP | 2000-349225 A | 12/2000 |

* cited by examiner

*Primary Examiner*—Anthony Dinkins
*Assistant Examiner*—Nguyen T. Ha
(74) *Attorney, Agent, or Firm*—Sughrue Mion, PLLC

(57) ABSTRACT

A capacitor includes a capacitor main body having a front surface on which a semiconductor device is to be mounted and a rear surface at which the capacitor main body is to be mounted on a first main surface of a circuit substrate, a plurality of internal electrodes disposed within the capacitor main body, and a plurality of via conductors penetrating the capacitor main body between the front surface and the rear surface and electrically connected to the internal electrodes, wherein the capacitor main body has a first dielectric layer located on a side of the capacitor main body closer to the front surface and a second dielectric layer located on a side of the first dielectric layer closer to the rear surface, the second dielectric layer having a higher thermal expansion coefficient and a higher dielectric constant than the first dielectric layer.

28 Claims, 5 Drawing Sheets

CAPACITOR, CAPACITOR EQUIPPED SEMICONDUCTOR DEVICE ASSEMBLY, CAPACITOR EQUIPPED CIRCUIT SUBSTRATE ASSEMBLY AND ELECTRONIC UNIT INCLUDING SEMICONDUCTOR DEVICE, CAPACITOR AND CIRCUIT SUBSTRATE

BACKGROUND OF THE INVENTION

The present invention relates to a capacitor, capacitor equipped semiconductor device assembly, capacitor equipped circuit substrate assembly and an electronic unit including a semiconductor device, capacitor and circuit substrate.

Recently, it has been proposed a circuit substrate equipped with an IC chip mounted capacitor, the IC chip being not directly connected to the circuit substrate but connected to the same by interposing therebetween the capacitor that is mounted in a recess of the circuit substrate for the purpose of providing the IC chip with a good electric power supply while removing noise as disclosed in Unexamined Japanese Patent Publication No. 2000-349225.

SUMMARY OF THE INVENTION

However, in case of the above-described circuit substrate equipped with the IC chip mounted capacitor, the capacitor needs be mounted in the recess of the circuit substrate while being surrounded by an insulating resin layer. This causes a problem that the circuit substrate is required to have an increased space for disposition of the insulating resin layer. A further problem of the circuit substrate is that there is a difficulty in disposition of an internal wiring and there is necessitated an increased work time for forming the recess and disposing the capacitor in the recess.

To solve the problem, it is considered to dispose the capacitor between the bottom surface of the IC chip and the first main surface of the circuit substrate. However, if a capacitor having connecting terminals at front and rear surfaces is disposed between an IC chip made of Si of a low thermal expansion coefficient and a circuit substrate made of insulating resin of a high thermal expansion coefficient to join the capacitor and the circuit substrate by way of the connecting terminals, there occurs a problem that a capacitor main body is bent or curved to cause some of joining portions to break due to the difference in the thermal expansion coefficient between the capacitor and circuit substrate and due to the fact that the capacitor is generally low in the Young's modulus.

It is accordingly an object of the present invention to provide a capacitor, capacitor equipped semiconductor device assembly, capacitor equipped circuit substrate assembly and an electronic unit including a semiconductor device, capacitor and circuit substrate, which capacitor is free from the above-noted problem and can be assuredly installed between a semiconductor device such as a IC chip and a circuit substrate mainly made of insulating resin.

To achieve the above object, the present invention has been made based on an idea of forming a dielectric layer that constitutes a main body of a capacitor, from a stacked or laminated body consisting of a first dielectric layer and a second dielectric layer, the second dielectric layer being higher in a thermal expansion coefficient and dielectric constant than the first dielectric layer. Namely, there is provided according to an aspect of the present invention a capacitor comprising a capacitor main body having a front surface on which a semiconductor device is to be mounted and a rear surface at which the capacitor main body is to be mounted on a first main surface of a circuit substrate, a plurality of internal electrodes disposed inside the capacitor main body, and a plurality of via conductors penetrating the capacitor main body between the front surface and the rear surface and electrically connected to the internal electrodes, wherein the capacitor main body has a first dielectric layer located on a side of the capacitor main body closer to the front surface and a second dielectric layer located on a side of the first dielectric layer closer to the rear surface, the second dielectric layer being higher in a thermal expansion coefficient and dielectric constant than the first dielectric layer.

By this, on the front surface side on which the semiconductor device is to be mounted is located the first dielectric layer having a lower thermal expansion coefficient, and on the rear surface side at which the capacitor itself is to be mounted on the first main surface of the circuit substrate or at a side closer to the rear surface is located the second dielectric layer having a higher thermal expansion coefficient and a higher dielectric constant. For this reason, even when the above-described capacitor is disposed between a semiconductor device and a circuit substrate mainly made of resin and is subjected to thermal variations, there is not caused breakage of the electrical connecting portions at the front surface of the capacitor on which the semiconductor device is mounted and at the rear surface of the capacitor at which the capacitor is mounted on the first main surface of the circuit substrate and the capacitor itself is not bent or curved, thus making it possible to attain stable and reliable electrical connection therebetween.

In the meantime, the thermal expansion coefficient of the first dielectric layer is less than 10 ppm/° C. and the thermal expansion coefficient of the second dielectric layer is 10 ppm/° C. or more. Further, the dielectric constant ($\in$r) of the first dielectric layer is less than 15 and the dielectric constant ($\in$r) of the second dielectric layer is 15 or more.

It will additionally be said that the capacitor in which the first dielectric layer has a high Young's modulus is encompassed within the present invention. Due to the high Young's modulus, when the first dielectric layer is subjected to stress due to thermal expansion, the resulting deformation is small and therefore the first dielectric layer exhibits a low thermal expansion property. Thus, the above-described Young's modulus is determined to be 200 GPa or higher and preferably 300 GPa or higher.

Further, it will additionally be said that the capacitor in which the internal electrodes are disposed inside the second dielectric layer and opposed to each other with certain intervals therebetween is encompassed within the present invention.

According to a further aspect of the present invention, the capacitor main body further comprises a first dielectric layer located on a side of the capacitor main body closer to the rear surface, the second dielectric layer being located between the first dielectric layers.

By this, the capacitor main body is constructed so as to have a three-layered structure having a pair of the first dielectric layers and the second dielectric layer interposed between the first dielectric layers. Thus, one of the first dielectric layers located on the rear surface side is more liable to cause thermal expansion due to the influence of the adjoining second dielectric layer. For this reason, there does not occur any breakage not only at the electrical connecting portions at the front surface on which the semiconductor device is mounted but also at the electrical connecting portions at the rear surface at which the capacitor is mounted on the first main surface of the circuit substrate, and the capacitor itself is not bent or curved even when the capacitor is subjected to thermal variations, thus making it possible to attain stable and reliable electrical connection between the capacitor and the semiconductor device. In the meantime, in case the first dielectric layer has a high Young's modulus of 200 GPa or more, a three-layer structure in which the second dielectric layer of a higher dielectric constant is interposed between the first dielectric layers of a higher Young's modulus is attained, thus making higher the rigidity. For this reason, it becomes possible to prevent bending or curving of the capacitor main body itself more assuredly and enable the electrical connecting portions to be improved further in the electrical connection reliability.

According to a further aspect of the present invention, the first dielectric layer comprises portions located at a front surface side, a rear surface side and a lateral periphery of the capacitor main body so that the second dielectric layer is enclosed in the first dielectric layer.

By this, a dual structure consisting of the first dielectric layer and the second dielectric layer surrounded by the first dielectric layer is attained. Thus, the portion of the first dielectric layer located on the rear surface side of the capacitor is more liable to cause thermal expansion due to the influence of the second dielectric layer located next thereto, thus making it possible to attain assured and reliable electrical connection at the front surface side and the rear surface side similarly as described above and prevent bending or curving of the capacitor itself.

According to a further aspect of the present invention, there is provided a capacitor-equipped semiconductor device assembly comprising the above-described capacitor and a semiconductor device mounted on the front surface of the capacitor and having at a bottom surface thereof a plurality of connecting terminals. By this, the capacitor hard to be bent and the semiconductor device mounted on the front surface of the capacitor are electrically connected to each other at a location between the front surface of the first dielectric layer having a lower thermal expansion coefficient and the bottom surface of the main body of the semiconductor device. For this reason, the charge stored in the capacitor can be supplied to the circuit elements within the circuit device in the shortest distance, and the above-described electrical connecting portions are never broken when subjected to thermal variations, thus making it possible to attain stable and reliable electrical conduction.

According to a further aspect of the present invention, there is provided a capacitor-equipped circuit substrate assembly comprising the above-described capacitor and a circuit substrate having a first main surface on which the capacitor is mounted and a second main surface, wherein at least the first main surface and the second main surface are formed by insulating resin layers. By this, the above-described circuit substrate and the capacitor mounted on the first main surface of the circuit substrate are electrically connected to each other at a location between the insulating resin layer having a high thermal expansion coefficient and the second dielectric layer having a high dielectric constant or the insulating resin layer having a high thermal expansion coefficient and the first dielectric layer located next to the second dielectric layer having a high dielectric constant. Due to this, the charge stored in the capacitor can be supplied to the internal electrodes of the circuit substrate through relative short conduction paths, and the capacitor itself is not bent or curved even when subjected to thermal variations, thus making it possible to prevent breakage of the above-described electrical connecting portions and attain stable electrical conduction.

In the meantime, the above-described circuit substrate can be of the type in which the core substrate is made of ceramic, provided that the first main surface and the second main surface are made of insulating resin layers.

According to a further aspect of the present invention, there is provided an electronic unit comprising the above-described capacitor, a semiconductor device mounted on the front surface of the capacitor and having at a bottom surface a plurality of connecting terminals, and a circuit substrate having a first main surface on which the capacitor is mounted and a second main surface, wherein at least the first main surface and the second main surface are formed by insulating resin layers. By this, the capacitor and the semiconductor device mounted on the front surface of the capacitor are electrically connected to each other at a location between the first dielectric layer having a low thermal expansion coefficient and the bottom surface of the main body of the semiconductor device. The circuit substrate and the capacitor mounted on the first main surface of the circuit substrate are electrically connected to each other at a location between the insulating resin layer having a high thermal expansion coefficient and the second dielectric layer having a high dielectric constant. Due to this, the charge stored in the capacitor can be supplied to the circuit elements within the circuit device in the shortest distance and to the internal electrodes within the circuit substrate through relatively short conduction paths. Furthermore, the capacitor is not bent or curved even when subjected to thermal variations, and the electrical connecting portions among the three, i.e., the semiconductor device, capacitor and circuit substrate, are not broken, thus making it possible to attain stable electrical conduction.

DESCRIPTION OF THE PREFERRED EMBODIMENTS

Figure 1A:
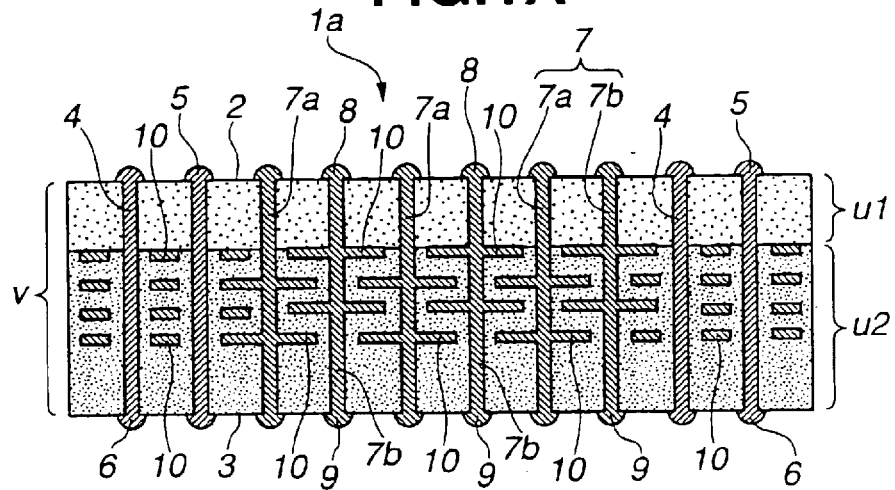
FIGS. 1A to 1C are schematic sectional views of capacitors according to embodiments of the present invention.

Referring first to FIG. 1A, a capacitor 1a according to an embodiment of the present invention includes a capacitor main body v having a front surface 2 on which a semiconductor device which will be described later is to be mounted and a rear surface 3 at which the capacitor 1a is to be mounted on a first main surface of a circuit substrate which will be described later, a plurality of front surface side bumps 5, 8 formed on the front surface 2 and a plurality of rear surface side bumps 6, 9 formed on the rear surface 3.

The capacitor main body v has a square or rectangular shape when observed in a plan view and includes a first dielectric layer u1 positioned on a front surface 2 side and having a low thermal expansion coefficient and a high Young's modulus (200 GPa or larger) and a second dielectric layer u2 positioned on a rear surface 3 side and having a higher thermal expansion coefficient and a higher dielectric constant than the first dielectric layer u1.

The first dielectric layer u1 is made of a material having a low dielectric constant and a low thermal expansion coefficient such as alumina (dielectric constant $\varepsilon r$ of about 10 and thermal expansion coefficient of about 7 ppm/° C.). The second dielectric layer u2 is made of a material having a higher dielectric constant and a higher thermal expansion coefficient than the first dielectric layer u1 such as $BaTiO_3$ (dielectric constant $\varepsilon r$ is about 2000 to 3000 and thermal expansion coefficient is about 13 ppm/° C.)

As shown in FIG. 1A, the second dielectric layer u2 has a plurality of internal electrodes 10 that are disposed therewithin and opposed in the thickness direction of the capacitor main body v. The internal electrodes 10 are connected to either of power via conductors 7a or ground via conductors 7b that penetrate through a central portion and its adjacent portion of the capacitor main body v. The via conductors 7a, 7b are disposed alternately in the direction of extension of front surface 2 or rear surface 3 and connected to front surface side and rear surface side bumps 8, 9. In the meantime, both of the power via conductors 7a and ground via conductors 7b constitute via conductors 7 of the present invention.

Herein, alternately disposed in the capacitor main body v are the internal electrodes 10 connected to the power via conductors 7a and the internal electrodes 10 connected to ground via conductors 7b, so that the capacitor 1a is a so-called via array type multilayered capacitor. In the multilayered capacitor, the power via conductors 7a are electrically insulated from the internal electrodes 10 connected to the ground via conductors 7, while the ground via conductors 7b are electrically insulated from the internal electrodes 10 connected to the power via conductors 7a.

Further, as shown in FIG. 1A, at a peripheral portion of the capacitor main body v are disposed two inner and outer rows of signal via conductors 4 that penetrate the capacitor main body v between the front surface 2 and the rear surface 3 while passing through-holes of the internal electrodes 10 and are connected to the front surface side and rear surface side bumps 5, 6.

In the meantime, the internal electrodes 10, the signal via conductors 4, the via conductors 7, the front surface side bumps 5, 8 and the rear surface side bumps 6, 9 are made of metal such as Cu, Au, Ag, Ni, Pd, W, Mo, Sn and Ti or an alloy containing any of those metals as a base metal.

By the capacitor 1a described as above, the charge (electric power) corresponding to the electrostatic capacity between the internal electrodes 10 disposed inside the second dielectric layer u2 can be supplied to a semiconductor device (not shown) mounted on the front surface 2 in the shortest distance through the power via conductors 7a and the front surface side bumps 8. Further, by way of the front surface side bumps 5, the signal via conductors 4 and the rear surface side bumps 6, transmission and reception of signals between the semiconductor device and a circuit substrate (not shown) on which the capacitor 1a is mounted at the rear surface 3 can be obtained.

Furthermore, the capacitor main body v that is disposed between the semiconductor device made of a material having a relatively low thermal expansion coefficient such as Si and the circuit substrate made of a material having a relatively high thermal expansion coefficient such as insulating resin, is not curved or bent even if subjected to thermal variations, thus making it possible to assuredly prevent breakage of the electrical joining portions where the front surface side bumps 5, 8 and the rear surface side bumps 6, 9 are joined with the mating connecting terminals.

Accordingly, by the capacitor 1a, stable supply of power to the semiconductor device and stable relay of signals between the semiconductor device and the circuit substrate can be attained. In other words, the capacitor 1a also serves as a capacitor built-in interconnect substrate (interposer).

Figure 1B:
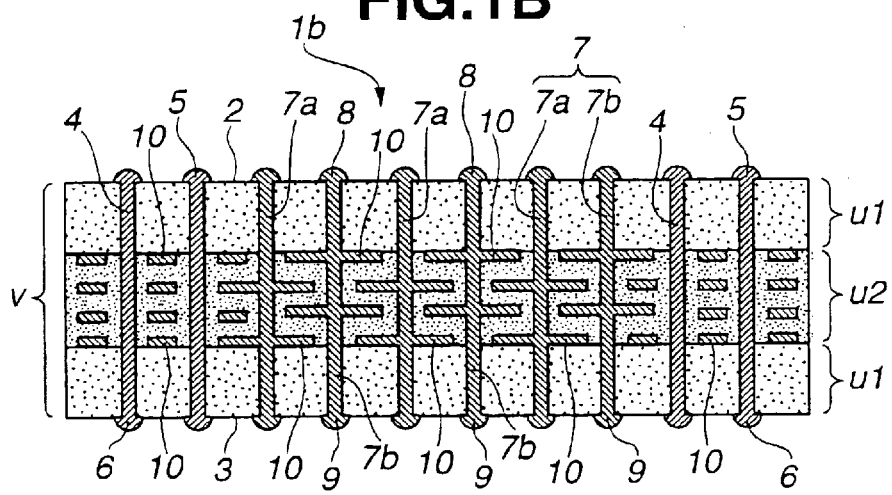

Referring to FIG. 1B, a capacitor 1b according to a modification of the present invention will be described. In FIG. 1B, like parts and portions to those of the previous embodiment of FIG. 1A will be designated by like reference characters. As shown, the capacitor 1b includes a capacitor main body v having a front surface 2 and a rear surface 3, a plurality of front surface side bumps 5, 8 and a plurality of rear surface side bumps 6, 9. The capacitor main body v is a three-layered structure and includes a first dielectric layer u1 that is similar to that of the previous embodiment and located on a front surface 2 side, a second dielectric layer u2 that is similar to that of the previous embodiment and located on a side of the first dielectric layer u1 closer to the rear surface 3 and another first dielectric layer u1 located on a side of the second dielectric layer u2 closer to the rear surface 3.

As shown in FIG. 1B, within the second dielectric layer u2 located between the first dielectric layers u1 are disposed a plurality of internal electrodes 10 similarly to the previous embodiment. The internal electrodes 10 are connected to either of power via conductors 7a penetrating a central portion and its adjacent portion of the capacitor main body v or ground via electrodes 7b. The via conductors 7a, 7b are connected to the front surface side and rear surface side bumps 8, 9.

Further, as shown in FIG. 1B, at the peripheral portion of the capacitor main body v are disposed signal via conductors 4 that are similar to those of the previous embodiment. The signal via conductors 4 penetrate the capacitor main body v between the front surface 2 and the rear surface 3 while passing through-holes of the internal electrodes 10 and are connected to the front surface side and rear surface side bumps 5, 6 individually.

By the capacitor 1b, the charge between the internal electrodes 10 can be supplied to the semiconductor device (not shown) mounted on the front surface 2 in the shortest distance through the power via conductors 7a and the front surface side bumps 8, and transmission and reception of signals between the semiconductor device and a circuit substrate on which the capacitor 1b is mounted at the rear surface 3, can be obtained through the front surface side and rear surface side bumps 5, 6 and the signal via conductors 4. Further, since the capacitor main body v has the above-described three-layered structure though the relatively thin first dielectric layer u1 having a low thermal expansion coefficient and a low dielectric constant is positioned also on the rear surface 3 side, the pair of first dielectric layers u1 and the second dielectric layer u2 interposed between the first dielectric layers u1 act upon each other so as to offset stress caused by thermal expansion (thermal contraction). As a result, even when the semiconductor device having a relatively low thermal expansion coefficient and the circuit substrate made of insulating resin and having a relatively high thermal expansion coefficient are subjected to thermal variations, the capacitor main body v is never bent or curved, thus making it possible to prevent breakage of the electrical connecting portions where the front surface side bumps 5, 8 and the rear surface side bumps 6, 9 are connected to the mating connecting terminals, assuredly.

In the meantime, the capacitor 1b can also be called a capacitor built-in interconnect substrate (interposer) Further, from the point of view of a power supply (decoupling) function, it is preferable that the second dielectric layer u2 is positioned at the middle of the capacitor main body v with respect to the thickness direction thereof or at a place a little closer to the front surface 2, namely, the second dielectric layer has the thickness equal to or smaller than that of the front surface 2 side first dielectric layer u1 though not so shown in FIG. 1B.

Figure 1C:
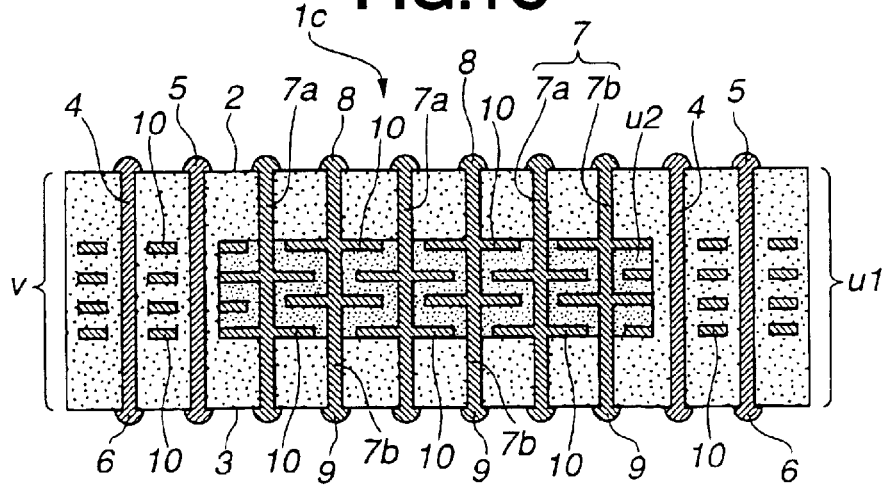

Referring to FIG. 1C, a capacitor 1c according to a further modification of the present invention will be described. In FIG. 1C, like parts and portions to those of the embodiment of FIG. 1A will be designated by like reference characters. Similarly to the previous embodiment of FIG. 1A, the capacitor 1c includes a capacitor main body v having a front surface 2 and a rear surface 3, a plurality of front surface side bumps 5, 8 and a plurality of rear surface side bumps 6, 9. The capacitor main body v has a dual structure and includes a first dielectric layer u1 similar to that of the previous embodiment of FIG. 1A and having portions that are positioned at a front surface 2 side, a rear surface 3 side and a lateral periphery of the capacitor main body v and a second dielectric layer u2 surrounded by those portions of the first dielectric layer u1 and located closer to the rear surface 3 than the front surface 2 side portion of the first dielectric layer u1.

As shown in FIG. 1C, within the second dielectric layer u2 located at or adjacent the center of the capacitor main body v are disposed a plurality of internal electrode 10 similarly to the previous embodiment of FIG. 1A. The internal electrodes 10 are connected to either of power via electrodes 7a or ground via electrodes 7b that penetrate the central portion and its adjacent portion of the capacitor main body v. The via conductors 7a, 7b are connected to the front surface side and rear surface side bumps 8, 9.

Further, as shown in FIG. 1C, signal via conductors 4 similar to those of the previous embodiment of FIG. 1A are disposed in the peripheral portion of the capacitor main body v so as to penetrate the capacitor main body v between the front surface 2 and the rear surface 3 while passing throughholes of the internal electrodes 10.

By the capacitor 1c described as above, power can be supplied to the semiconductor device (not shown) mounted on the front surface 2 in the shortest distance, and transmission and reception of signals between the semiconductor device and a circuit substrate on which the capacitor 1c is mounted at the rear surface 3, can be obtained through the signal via conductors 4, etc. Further, since the capacitor main body v has such a dual structure described as above, the first dielectric layer u1 at the peripheral portion and the second dielectric layer u2 surrounded by the first dielectric layer u1 act upon each other so as to offset stress caused by thermal expansion (thermal contraction). Thus, even when the semiconductor device and the circuit substrate mainly made of insulating resin are subjected to thermal variations, the capacitor main body v is never bent or curved, thus making it possible to prevent breakage of the electrical connecting portions where the front surface side bumps 5, 8 and the rear surface side bumps 6, 9 are connected to the mating connecting terminals, assuredly.

In the meantime, the capacitor 1c can also be called a capacitor built-in interconnect substrate (interposer). Further, from the point of view of a power supply (decoupling) function, it is preferable that the second dielectric layer u2 is positioned at the middle of the capacitor main body v with respect to the thickness direction thereof or a little closer to the front surface 2, namely, the second dielectric layer u2 has the thickness equal to or smaller than that of the surface 2 side portion of the first dielectric layer u1 though not so shown in FIG. 1C.

Figure 2A:
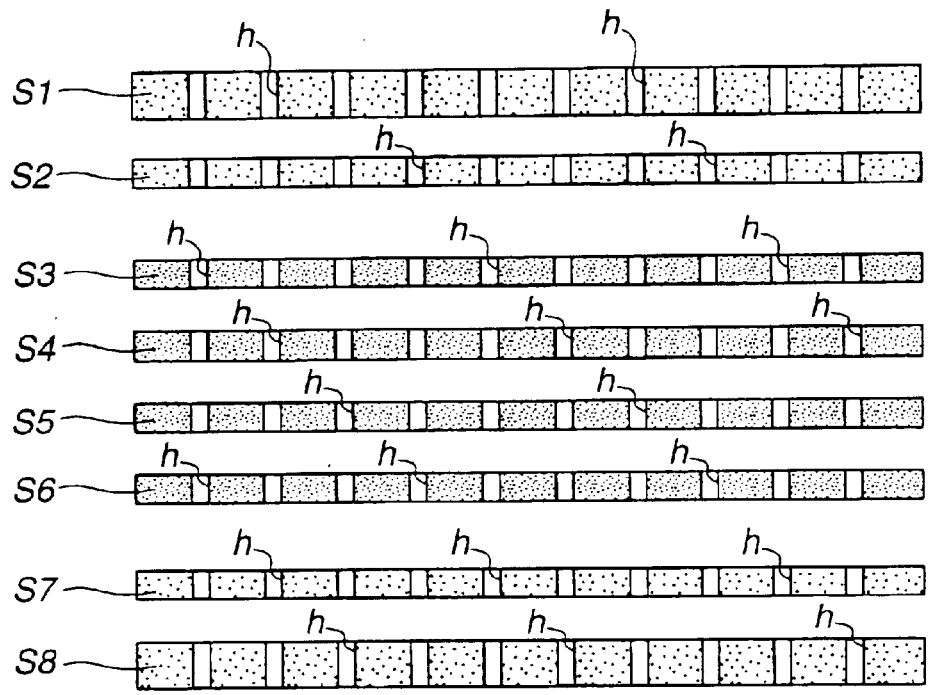
FIGS. 2A and 2B are schematic views for illustrating the process for manufacturing the capacitor of FIG. 1B.

Herein, the method of making the above-described capacitors 1a to 1c will be described by taking the capacitor 1b for example with reference to FIGS. 2A and 2B. As shown in FIG. 2A, a plurality of green sheets S1 to S8 to be formed into the first dielectric layers u1 of the above-described capacitor main body v and the second dielectric layer u2 to be interposed between the first dielectric layers u1 are prepared beforehand. The green sheets S1, S2, S7, S8 to be formed into the first dielectric layers u1 are about 20 to 150 $\mu$m thick and contain alumina as a major component. Further, the green sheets S3 to S6 to be formed into the second dielectric layer u2 is about 1 to 10 $\mu$m thick and contains $BaTiO_3$ as a major component. The green sheets S3 to S6 are formed on a carrier film (not shown) that is about 25 to 50 $\mu$m thick and made of polyethylene terephthalate (PET).

First, as shown in FIG. 2A, the green sheets S1 to S8 are formed at predetermined positions thereof with via holes h of about 90 $\mu$m in diameter by carbon dioxide gas laser or the like. In this instance, the green sheets S3 to S6 are formed with the via holes h in a way that the via holes h do not penetrate the above-described carrier film.

Then, by using a metal mask and squeeze (not shown), via conductors 4c, 7c made of, for example, conductive paste containing W powder are filled and formed in the respective via holes h of the green sheets S1, S2, S7, S8. Further, on the upper surfaces of the green sheets S3 to S6 and in the via holes h are formed and filled by screen printing the internal electrodes 10 and the via conductors 4c, 7c made of conductive paste.

Figure 2B:
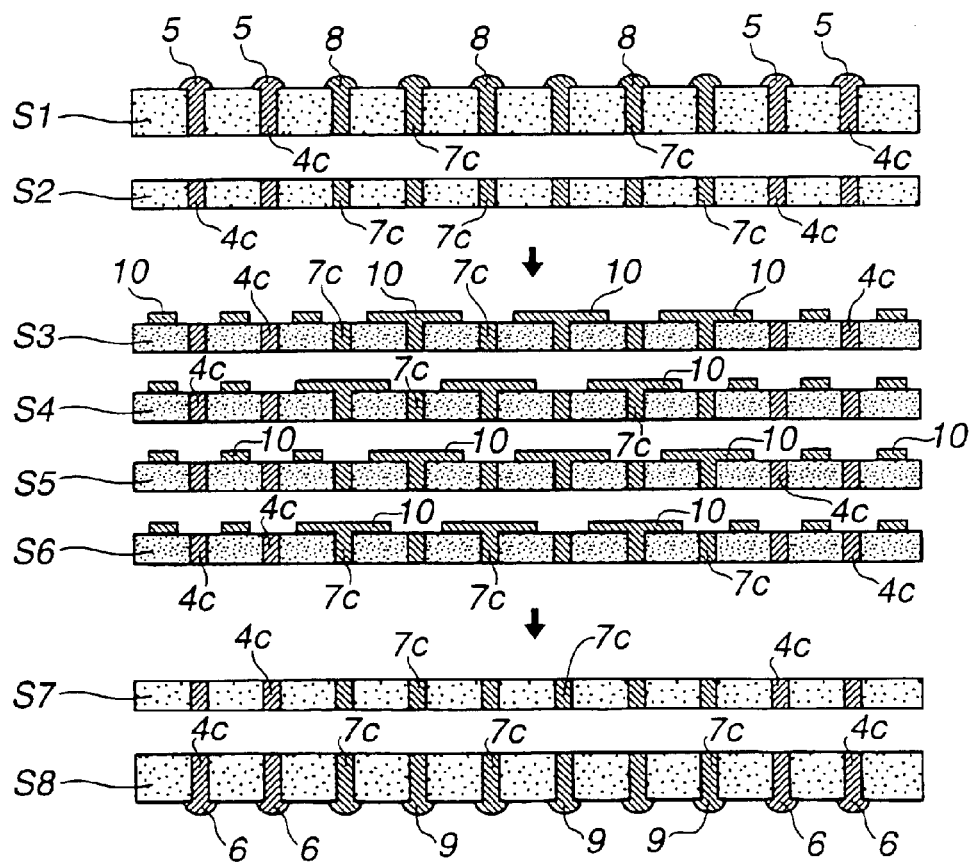

As shown in FIG. 2B, at the time the internal electrodes 10 are formed by the above-described screen printing, the via conductors 4c made of conductive paste are formed so as to be electrically insulated from the internal electrodes 10. Further, the via conductors 7c made of conductive paste and to be formed into the power via conductors 7a are formed so as to be electrically insulated from the internal electrodes 10 at the upper surfaces of the green sheets S3, S5. Further, the via conductors 7c made of conductive paste and to be formed into the ground via conductors 7b are formed so as to be electrically insulated from the internal electrodes at the upper surfaces of the green sheets S4, S6.

Then, as indicated by the arrows in FIG. 2B, the green sheets S1 to S8 are stacked while being pressed to stick together and thereafter fired or sintered at a temperature within a known temperature range for a predetermined time.

Then, as shown in FIG. 2B, on the upper surface of the green sheet S1 after sintering are formed by screen printing front surface side bumps 5, 8 made of the above-described conductive paste and having a nearly semi-spherical shape. By the similar method, on the lower surface of the green sheet S8 after sintering are formed rear surface side bumps 6, 9. The front surface side bumps 5, 6 are connected to the respective signal via conductors 4, and the rear surface side bumps 8, 9 are connected to the power via conductors 7a or the ground via conductors 7b.

As a result, the capacitor 1b having the capacitor main body v with the upper surface 2 and the rear surface 3 and the signal via conductor 4 and the via conductors 7 (7a, 7b) penetrating the capacitor main body v is obtained.

In the meantime, by using $BaTiO_3$ also for the green sheets S7, S8, the above-described capacitor 1a can be obtained. Further, by forming the green sheets S3 to S6 from alumina and into a rectangular frame shape so as to constitute part of the first dielectric layer u1, filling inside the green sheets S3 to S6 insulating paste containing $BaTiO_3$, that is to be formed into the second dielectric layer u2, by screen printing, thereafter forming the via holes h and filling the via conductors 4c, 7c made of conductive paste, the above-described capacitor 1c can be obtained.

Further, the first dielectric layer u1 may be made of, other than alumina, aluminum nitride, silicon nitride, glass ceramic or low temperature sintering ceramic, and the second dielectric layer u2 may be made of, other than $BaTiO_3$, $SrTiO_3$, $PbTiO_3$, $(Ba—Sr)TiO_3$.

Figure 3A:
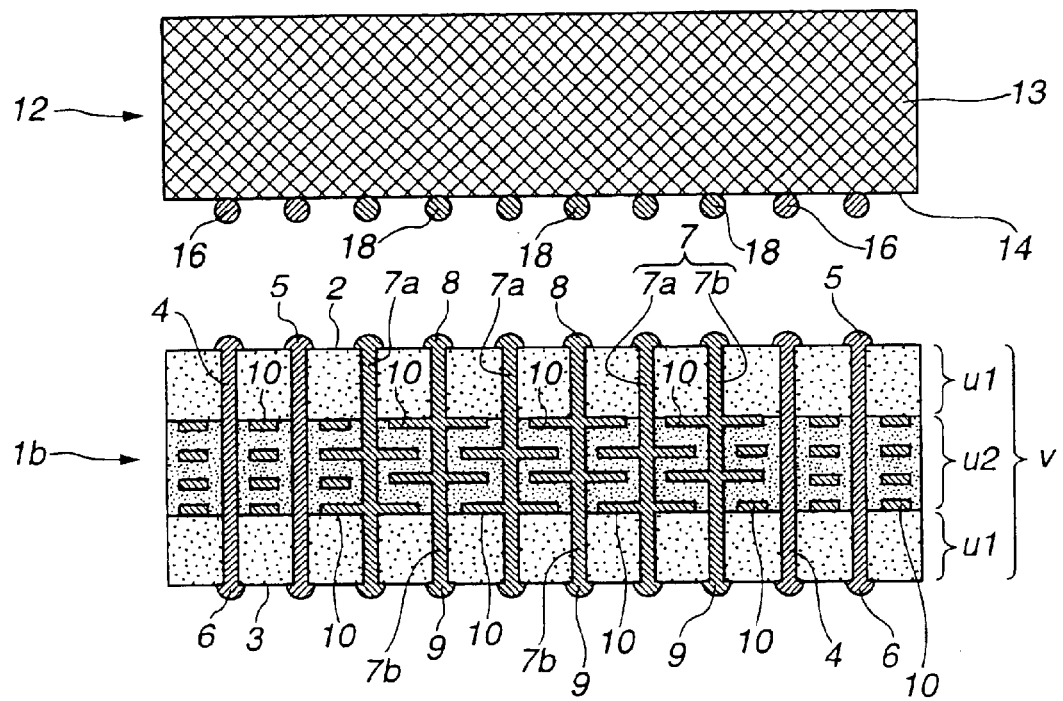
FIGS. 3A and 3B are sectional views for showing a capacitor equipped semiconductor device assembly according to a further embodiment of the present invention and its manufacturing process.

FIG. 3A shows the above-described capacitor 1b in a state immediately before an IC chip (semiconductor device) 12 is mounted on the front surface 2 of the capacitor 1b. Such an IC chip 12 includes a main body 13, for example, in the form of a flat plate with a side of 10 mm and made of Si having a low thermal expansion coefficient, i.e., about 3 ppm/° C. and is formed with a circuit device (not shown) that functions as a MPU. Further, as shown in FIG. 3A, at the bottom surface 14 of the main body 13 is formed a plurality of connecting terminals 16, 18 in the form of a bump. Of those terminals, the connecting terminals 16 are arranged in two rows, i.e., inner and outer rows so as to be located at the peripheral portion of the bottom surface 14. On the inner side of the connecting terminals 16 are located the connecting terminals 18 that are arranged in a grid array or in a zigzag array.

As shown in FIG. 3A, the connecting terminals 16 located at the peripheral portion of the bottom surface 14 of the IC chip 12 are opposed to the respective front surface side bumps 5 located on the peripheral portion of the front surface 2 of the capacitor 1b, and the connecting terminals 18 of the IC chip 12 are opposed to the surface side bumps 8 located on the central portion of the front surface 2 of the capacitor 1b.

Under the condition where masses of molten solder 19 are placed on the respective surface side bumps 5, 8, the connecting terminals 16, 18 of the IC chip 12 are joined to the respective masses of solder 19, individually.

Figure 3B:
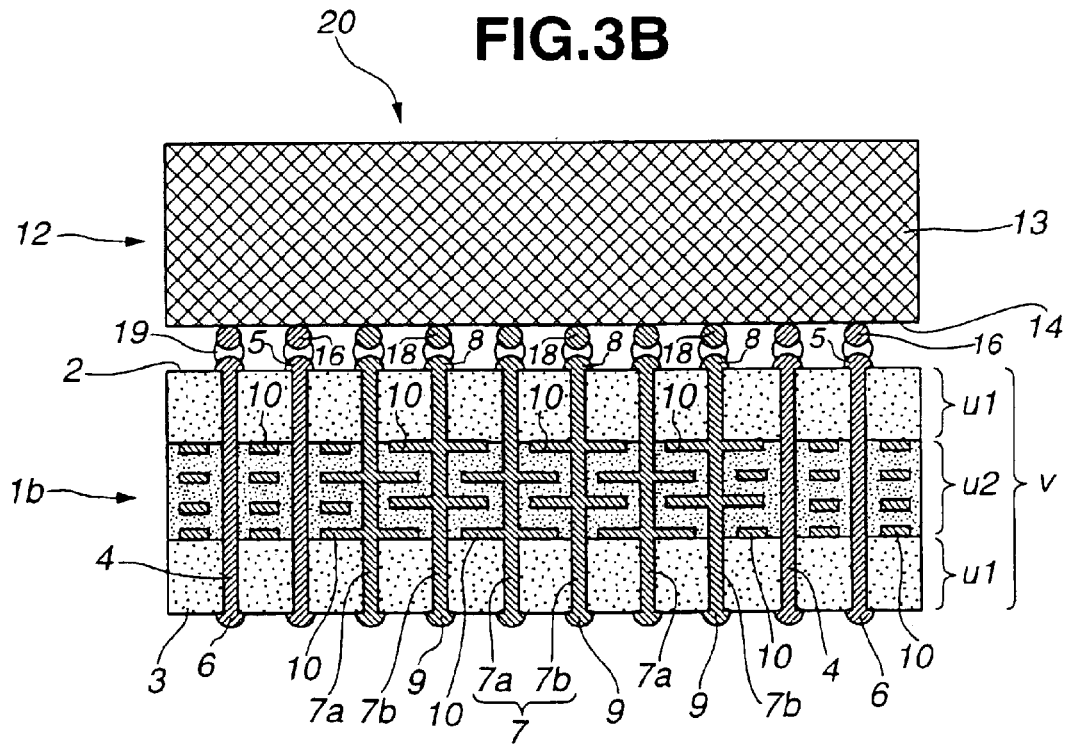

As a result, as shown in FIG. 3B, the surface side bumps 5, 8 and the connecting terminals 16, 18 that are opposed to each other by way of the masses of solder 16 are electrically connected such that a capacitor equipped semiconductor device assembly 20 in which the IC chip 12 is mounted on the surface 2 of the capacitor 1b is formed. In the meantime, in case the front surface side bumps 5, 8 of the capacitor 1b are made of a low melting point metal equal to the masses of solder 19 in melting point, it will do to dispense with the masses of solder 19 and join the bumps 5, 8 directly with the connecting terminals 16, 18 of the IC chip 12.

By the capacitor equipped semiconductor device assembly 20, as shown in FIG. 3B, the charge stored in the capacitor 1b is supplied to the IC chip 12 in the shortest distance through the power via conductors 7a, surface side bumps 8, masses of solder 19 and the connecting terminals 18.

Further, as shown in FIG. 3B, the connecting terminals 16 of the IC chip 12 are electrically conducted to the masses of solder 19 and the surface side bumps 5, signal via conductors 4 and rear surface side bumps 6 of the capacitor 1b. For this reason, when the capacitor 1b of the capacitor equipped semiconductor device assembly 20 is mounted on the first main surface of the circuit substrate (not shown) mainly made of insulating resin, transmission and reception of signals between the circuit device of the IC chip and the internal wiring of the circuit substrate can be attained by way of the above-described conducting paths. Furthermore, since the first dielectric layer u1 on the front surface 2 side of the capacitor 1b is located on the bottom surface 14 side of the main body 13 of the IC chip 12, which main body 13 is made of Si, the difference in the thermal expansion coefficient of the both can be made smaller. On the other hand, the first dielectric layer u1 having a high Young's modulus that is located on the rear surface 3 side of the capacitor 1b can make smaller the difference in the thermal expansion coefficient between the capacitor and the circuit substrate by the influence of the second dielectric layer u2 having a high expansion coefficient that is located next to the first dielectric layer u1.

Accordingly the capacitor equipped semiconductor device assembly 20 can attain stable supply of power to the IC chip 12 and an assured signal wiring between it and the circuit substrate on the first main surface of which it is mounted, so that even when the capacitor equipped semiconductor device assembly 20 is subjected to thermal variations, the capacitor 1b is never bent or curved, thus making it possible to prevent breakage of the joining portion at which the capacitor equipped semiconductor device assembly 20 and the above-described circuit substrate are joined.

In the meantime, in place of the capacitor 1b of the capacitor equipped semiconductor device assembly 20, either of the above-described capacitors 1a, 1c can be used.

Figure 4:
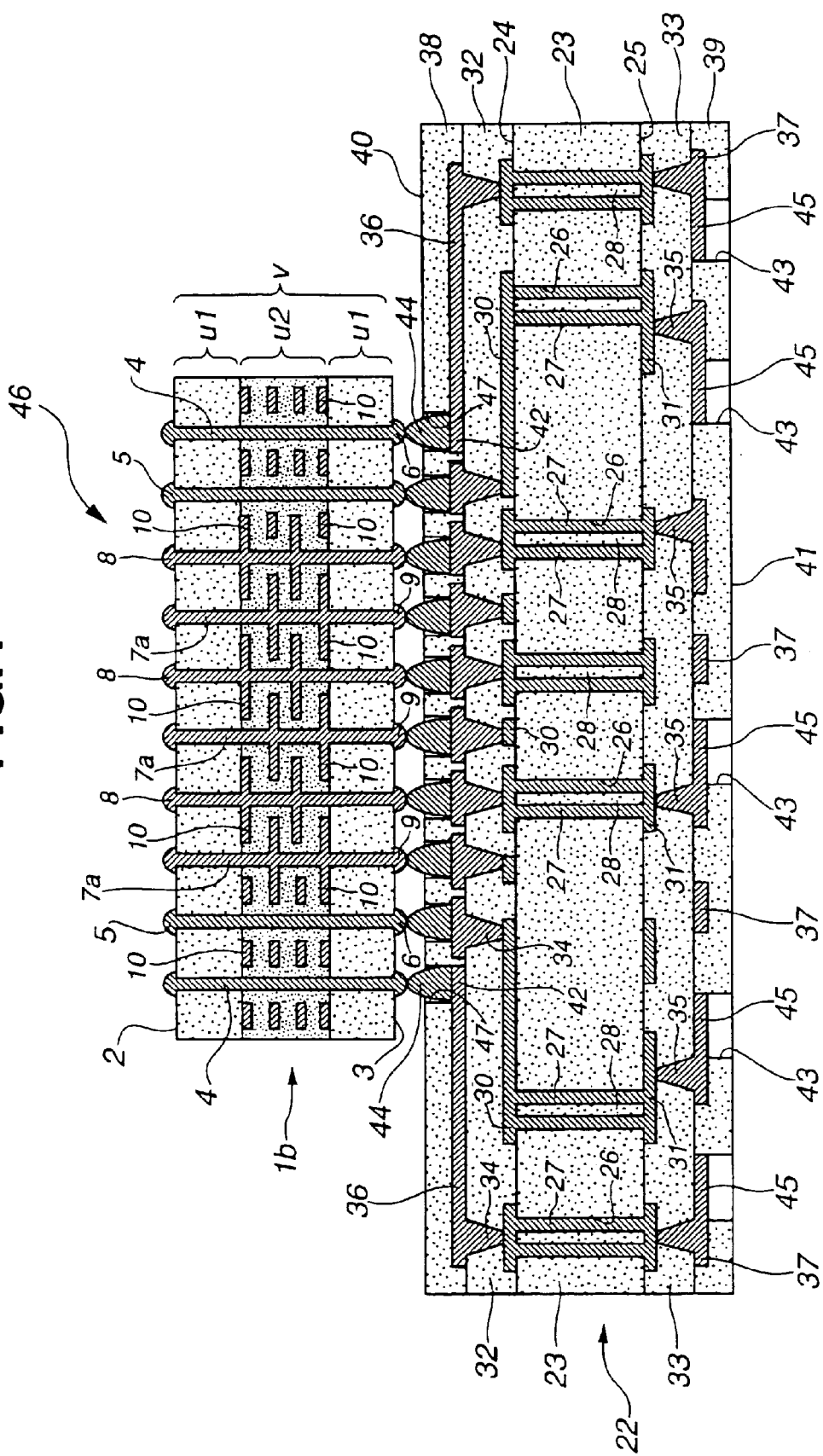
FIG. 4 is a schematic sectional view of a capacitor equipped circuit substrate assembly according to a further embodiment of the present invention.

FIG. 4 shows a capacitor equipped circuit substrate assembly 46 in which the capacitor 1b is mounted on a first main surface 40 of a circuit substrate 22.

The circuit substrate 22, as shown in FIG. 4, has a multilayered structure and includes a core substrate section 23 located centrally in the thickness direction, insulating resin layers 32, 38 located on a front surface 24 of the core substrate section 23 and insulating resin layers 33, 39 located on a rear surface 25 of the core substrate section 23. The core substrate section 23 is about 800 $\mu$m thick and made of a composite material of a glass-epoxy resin system. Between the front surface 24 and the rear surface 25 of the core substrate section 23 are formed a plurality of through holes 26, hollow cylindrical through hole conductors 27 formed on inner walls defining the through holes 26 and formed from a copper-plating film and resin fillers 28 filled inside the through hole conductors 27.

In the meantime, the core substrate section 23 may be made of ceramic. Such ceramic encompasses alumina, glass ceramic, mullite, aluminum nitride, etc. Furthermore, as such ceramic can be used low temperature sintering ceramic that can be sintered at a relative low temperature of about 1000° C. or lower.

Further, as shown in FIG. 4, on the front surface 24 and the rear surface 25 of the core substrate section 23 are individually formed wiring layers 30, 31 made of copper plating so as to have a predetermined pattern and a thickness of about 15 $\mu$m and connected to the upper ends or lower ends of the through hole conductors 27. Further, the insulating resin layers 32, 33 are about 40 $\mu$m thick and made of an epoxy system resin containing inorganic filler such as silica filler. The uppermost and lowermost insulating resin layers (solder resist layers) 38, 39 are about 25 $\mu$m thick made of the same resin as described above. By such insulating resin layers 38, 39 are formed first and second main surfaces 40, 41 of the circuit substrate 22.

Further, as shown in FIG. 4, between the upper insulating resin layers 32, 38 are formed wiring layers 36 made of copper plating and having a predetermined pattern and a thickness of about 15 μm. The wiring layers 36 are connected to the above-described wiring layers 30 by way of via conductors (filled via) 34. Further, between lower insulating resin layers 33, 39 are formed wiring layers 37 similar to those described as above. The wiring layers 37 are connected to the above-described wiring layers 31 by way of the via conductors 35.

At predetermined positions in the uppermost and lowermost insulating resin layers 38, 39 are formed openings 47, 43 by a laser machining process. At the bottoms of the openings 47, 43 are positioned first connecting terminals 42 and second connecting terminals 45, respectively.

As shown in FIG. 4, on the first connecting terminals 42 are provided nearly semi-spherical solder bumps 44 protruding outward of the first main surface 40. The solder bumps 44 are made of a lower melting point alloy such as Sn—Ag system, Sn—Ag—Cu system, Sn—Cu system, Sn—Zn system and Pb—Sn system and are electrically connected to the rear surface side bumps 6, 9 of the capacitor 1b mounted on the first main surface 40.

On the other hand, the second connecting terminals (lands) 45 are coated with Ni-plating and Au-plating and used for electrical conduction with a printed circuit board such as a mother board. Namely, the circuit substrate 22 is of a land grid array (LGA) type.

In the meantime, the circuit substrate 22 described as above is formed by a known semi-additive process, full-additive process, subtractive process, formation of an insulating resin layer by lamination of a resinous material in the form of film, a photo lithographic process, etc. Further, a conductive pin or ball may be joined to the surface of the second connecting terminal 45 so as to form the circuit substrate 22 into a pin grid array (PGA) type or a ball grid array (BGA) type.

By the above-described capacitor equipped circuit substrate assembly 46, as shown in FIG. 4, the charge stored in the capacitor 1b can be supplied to the wiring layers 36, 30 of the circuit substrate 22 by relative short conducting paths, i.e., through the power via conductors 7a, rear surface side bumps 9, solder bumps 44 and the first connecting terminals 42. Further, the signals from the wiring layers 36, 30 at the opposite sides of the circuit substrate 22 are transmitted to the front surface side bumps 5 by way of the first connecting terminals 42, solder bumps 44, rear surface side bumps 6 of the capacitor 1b and the signal via conductors 4. For this reason, by directly joining, for example, the connecting terminals 16 of the IC chip 12 mounted on the front surface 2 of the capacitor 1b and the above-described front surface side bumps 5 to each other or connecting the both by way of the solder masses 19, the above-described signals can be transmitted to the circuit device of the IC chip 12 or in the reverse direction.

Accordingly, by the capacitor equipped circuit substrate assembly 46, stable power supply to the internal wiring of the circuit substrate 22 can be attained, while at the same time by using the capacitor 1b as an interposer a signal wiring between the IC chip 12 mounted on the front surface 2 and the circuit substrate 22 can be attained assuredly. Further, the first dielectric layer u1 located on the rear surface 3 side of the capacitor 1b and having a high Young's modulus can make smaller the difference in the thermal expansion coefficient between the first dielectric layer u1 and the circuit substrate 22 by the influence of the second dielectric layer u2 having a high thermal expansion coefficient and located adjacent thereto. For this reason, the capacitor 1b is never bent or curved even when subjected to thermal variations, thus making it possible to prevent breakage of the electrical connection between the capacitor 1b and the circuit substrate 22 assuredly. In the meantime, the capacitor 1b of the capacitor equipped circuit substrate assembly 46 can be replaced by either of the capacitors 1a, 1c.

Figure 5:
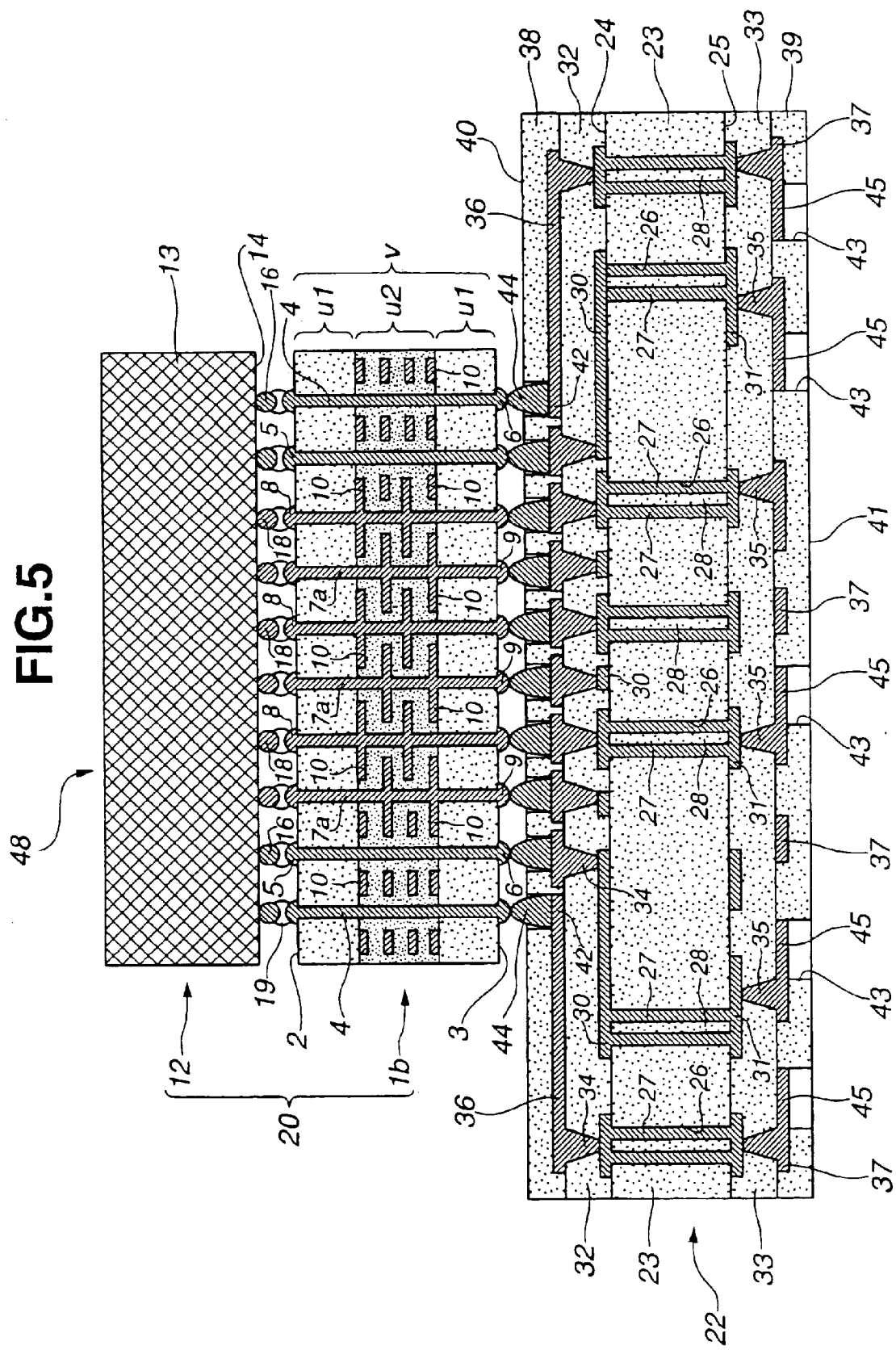
FIG. 5 is a schematic sectional view of an electronic unit according to a further embodiment of the present invention.

FIG. 5 shows an electronic unit (semiconductor package) 48 in which the above-described capacitor equipped semiconductor device assembly 20 is mounted on the first main surface 40 of the circuit substrate 22.

Namely, as shown in FIG. 5, on the plural solder bumps 44 protruding outward of the first main surface 40 of the circuit substrate 22 are placed the rear surface side bumps 6, 9 located on the rear surface 3 of the capacitor 1b of the capacitor equipped semiconductor device assembly 20 and opposed to the respective solder bumps 44. Then, the solder bumps 44 and the rear surface side bumps 6, 9 are subjected to heating at a predetermined temperature. As a result, as shown in FIG. 5, the rear surface side bumps 6, 9 of the capacitor 1b and the solder bumps 44 of the circuit substrate 22 are respectively joined together such that the electronic unit 48 can be attained. In the meantime, by the method of connecting directly or by way of the above-described solder masses 19 the connecting terminals 18, 19 of the IC chip 12 to the front surface side bumps 5, 8 of the capacitor 1b of the capacitor equipped circuit substrate assembly 46, the electronic unit 48 can be attained.

By the electronic unit 48, as shown in FIG. 5, the charge stored in the capacitor 1b can be supplied to the IC chip 12 in the shortest distance, i.e., through the power via conductors 7a, front surface side bumps 8, solder masses 19 and connecting terminals 18.

Further, power can be supplied to the wiring layers 36, 30 of the circuit substrate 22 through the power via conductors 7a, rear surface side bumps 9, solder bumps 44 and the first connecting terminals 42, i.e., by relatively short conducting paths, Further, as shown in FIG. 5, the signals from the wiring layers 36, 30 at the opposite sides of the circuit substrate 22 are transmitted to the IC chip 12 through the first connecting terminals 42, solder bumps 44, rear surface side bumps 6 of the capacitor 1b, signal via conductors 4, front surface side bumps 5, solder masses 19 and connecting terminals 16. On the other hand, the signals from the IC chip 12 are transmitted through the above-described electrical conducting paths in the reverse direction to the wiring layers 36.

In the meantime, the signal from the wiring layers 36 of the circuit substrate 22 is transmitted through the through hole conductors 27 at the opposite sides and the wiring layers 31, 37 at the lower side in FIG. 5 to a mother board (not shown) or the like.

Further, on the bottom surface 14 side of the main body 13 of the IC chip 12, which main body 13 is made of Si, is located the first dielectric layer u1 on the front surface 2 side of the capacitor 1b, so that the difference in the thermal expansion coefficient between them can be decreased. On the other hand, the first dielectric layer u1 on the rear surface 3 side of the capacitor 1b can make smaller the difference in the thermal expansion coefficient between the first dielectric layer u1 and the circuit substrate 22 having the insulating resin layers 38, 32 due to the influence of the second dielectric layer u2 having a high thermal expansion coefficient, that is located next to the first dielectric layer u1.

Accordingly, by the electronic unit 48 described as above, stable power supply from the capacitor 1b to the IC chip 12 can be attained and power supply to the circuit substrate 22 can be attained with ease. Further, the signal wiring between the IC chip 12 and the circuit substrate 22 can be attained with ease by using the capacitor 1b as an interposer, thus making it possible to attain high-speed and accurate operation of the IC chip 12 assuredly. Further, even when the IC chip 12, capacitor 1b and circuit substrate 22 are subjected to thermal variations, the main body v of the capacitor 1b is never bent or curved, thus making it possible to prevent breakage of electrical connection among those three and attain stable and assured electrical connection of the three.

In the meantime, in place of the capacitor 1b of the electronic unit 48, either of the above-described capacitors 1a, 1c can be used.

The entire contents of Japanese Patent Application P2003-176967 (filed Jun. 20, 2003) are incorporated herein by reference.

Although the invention has been described above by reference to certain embodiments of the invention, the invention is not limited to the embodiments described above. Modifications and variations of the embodiments described above will occur to those skilled in the art, in light of the above teachings.

For example, the above-described process of making the capacitor 1b may be modified as follows. Namely, on the upper surfaces of the green sheets S3 to S6 are formed conductive patterns to be formed into internal electrodes. After the green sheets S1 to S8 are stacked, long via holes h that penetrate the green sheets S1 to S8 are formed by a laser machining process. Then, the via holes h are filled with conductive paste and thereafter firing or sintering is performed. The capacitor 1b may be made in the above-described order. Further, a post sintering process can be used for making the capacitor 1b. Namely, the green sheets S1 to s8 having via holes h penetrating therethrough are prepared separately and sintered. Thereafter, conductive paste is filled in and printed on the respective green sheets S1 to S8 separately, and thereafter the green sheets S1 to S8 are stacked and sintered.

Further, the above-described semiconductor device may be an IC chip made of a material having a thermal expansion coefficient nearly equal to the above-described Si, or the IC chip may be replaced by a thermistor, optical-conductive device, barrister, hole device, photo transistor, trigger device, solar battery, EFT, SCR, coupler or the like.

Further, as the material of the core substrate section 23 in the circuit substrate 22 can be used, other than the above-described composite material of the glass-epoxy resin system, bismaleimide triazin (BT) resin, epoxy resin, woven glass fiber having a similar heat-resisting property, mechanical strength, flexibility, ease in working, etc., and a glass fiber-resin system consisting of glass fiber such as woven glass fiber and resin such as epoxy resin, polyimide resin and BT resin, or a composite material consisting of organic fiber such as polyimide fiber and resin or a resin-resin composite material obtained by impregnating a resin such as epoxy resin in a three-dimension network-shaped fluoroplastic base such as continuously porous PTFE (polytetrafluoroethylene).

Further, as the material for the insulating resin layers 32, 33 in the above-described circuit substrate 22 can be used, other than the above-described material containing epoxy resin as a major component, a material having a similar heat-resisting property and pattern formability, such as polyimide resin, BT resin, PPE resin and a resin-resin composite material obtained by impregnating a resin such as epoxy resin in a three-dimension network-shaped fluoroplastic base such as continuously porous PTFE (polytetrafluoroethylene) resin. In the meantime, for forming the insulation layer can be used, other than a method of joining insulating resin films together by heating and pressing, a method of applying resin in a liquid state to the core substrate by using a roll coater. In the meantime, for glass cloth or glass filler to be contained in the insulation layer can be any one of E glass, D glass, Q glass and S glass or any two of them in combination.

Further, the wiring layers 30 and the through hole conductors 27 in the above-described circuit substrate 22 can be formed by, other than Cu-plating, Ag plating, Ni-plating and Ni—Au-plating or not by using a metallic plating layer but by a method of applying conductive resin to the substrate.

Further, the via conductor in the above-described circuit substrate 22 is not necessarily the above-described filled via conductor 34 but can be a conformal via conductor of an inverted conical shape, the inside of which is not completely filled with conductor. Further, the via conductor can be of a staggered type in which sections of each via conductor are stacked so that the axes of adjacent two are misaligned from each other or of the type in which a horizontally extending wiring layer is provided at an intermediate portion of a via conductor.

Further, the above-described circuit substrate 22 can be of the type in which a build-up structure consisting of a plurality of insulating resin layers and a plurality of wiring layers interposed between the insulating resin layers is provided on at least one of the front surface 24 and the rear surface 25 of the core substrate section 23.

What is claimed is:

1. A capacitor comprising:
   a capacitor main body having a front surface on which a semiconductor device is to be mounted and a rear surface at which the capacitor main body is to be mounted on a first main surface of a wiring substrate;
   a plurality of internal electrodes disposed inside the capacitor main body; and
   a plurality of via conductors penetrating the capacitor main body between the front surface and the rear surface and electrically connected to the internal electrodes;
   wherein the capacitor main body has a first dielectric layer located on a side of the capacitor main body closer to the front surface and a second dielectric layer located on a side of the first dielectric layer closer to the rear surface, the second dielectric layer having a higher thermal expansion coefficient and a higher dielectric constant than the first dielectric layer.

2. A capacitor according to claim 1, wherein the capacitor main body further comprises a first dielectric layer located on a side of the capacitor main body closer to the rear surface, the second dielectric layer being located between the first dielectric layers.

3. A capacitor according to claim 1, wherein the first dielectric layer comprises portions located at a front surface side, a rear surface side and a lateral periphery of the capacitor main body so that the second dielectric layer is enclosed in the first dielectric layer.

4. A capacitor according to claim 1, wherein the thermal expansion coefficient of the first dielectric layer is less than 10 ppm/° C. and the thermal expansion coefficient of the second dielectric layer is 10 ppm/° C. or more.

5. A capacitor according to claim 1, wherein the dielectric constant of the first dielectric layer is less than 15 and the dielectric constant of the second dielectric layer is 15 or more.

6. A capacitor according to claim 1, wherein the first dielectric layer has a Young's modulus of 200 GPa or higher.

7. A capacitor according to claim 1, wherein the first dielectric layer has a Young's modulus of 300 GPa or higher.

8. A capacitor-equipped semiconductor device assembly comprising:
   a capacitor main body having a front surface on which a semiconductor device is to be mounted and a rear surface at which the capacitor main body is to be mounted on a first main surface of a wiring substrate, a plurality of internal electrodes disposed inside the capacitor main body, and a plurality of via conductors penetrating the capacitor main body between the front surface and the rear surface and electrically connected to the internal electrodes, wherein the capacitor main body has a first dielectric layer located on a side of the capacitor main body closer to the front surface and a second dielectric layer located on a side of the first dielectric layer closer to the rear surface, the second dielectric layer having a higher thermal expansion coefficient and a higher dielectric constant than the first dielectric layer; and
   a semiconductor device mounted on the front surface of the capacitor and having at a bottom surface thereof a plurality of connecting terminals.

9. A capacitor-equipped semiconductor device assembly according to claim 8, wherein the capacitor main body further comprises a first dielectric layer located on a side of the capacitor main body closer to the rear surface, the second dielectric layer being located between the first dielectric layers.

10. A capacitor-equipped semiconductor device assembly according to claim 8, wherein the first dielectric layer comprises portions located at a front surface side, a rear surface side and a lateral periphery of the capacitor main body so that the second dielectric layer is enclosed in the first dielectric layer.

11. A capacitor-equipped semiconductor device assembly according to claim 8, wherein the thermal expansion coefficient of the first dielectric layer is less than 10 ppm/° C. and the thermal expansion coefficient of the second dielectric layer is 10 ppm/° C. or more.

12. A capacitor-equipped semiconductor device assembly according to claim 8, wherein the dielectric constant of the first dielectric layer is less than 15 and the dielectric constant of the second dielectric layer is 15 or more.

13. A capacitor-equipped semiconductor device assembly according to claim 8, wherein the first dielectric layer has a Young's modulus of 200 GPa or higher.

14. A capacitor-equipped semiconductor device assembly according to claim 8, wherein the first dielectric layer has a Young's modulus of 300 GPa or higher.

15. A capacitor-equipped circuit substrate assembly comprising:
   a capacitor main body having a front surface on which a semiconductor device is to be mounted and a rear surface at which the capacitor main body is to be mounted on a first main surface of a wiring substrate, a plurality of internal electrodes disposed inside the capacitor main body, and a plurality of via conductors penetrating the capacitor main body between the front surface and the rear surface and electrically connected to the internal electrodes, wherein the capacitor main body has a first dielectric layer located on a side of the capacitor main body closer to the front surface and a second dielectric layer located on a side of the first dielectric layer closer to the rear surface, the second dielectric layer having a higher thermal expansion coefficient and a higher dielectric constant than the first dielectric layer; and
   a circuit substrate having a first main surface on which the capacitor is mounted and a second main surface;
   wherein at least the first main surface and the second main surface are formed by insulating resin layers.

16. A capacitor-equipped circuit substrate assembly according to claim 15, wherein the capacitor main body further comprises a first dielectric layer located on a side of the capacitor main body closer to the rear surface, the second dielectric layer being located between the first dielectric layers.

17. A capacitor-equipped circuit substrate assembly according to claim 15, wherein the first dielectric layer comprises portions located at a front surface side, a rear surface side and a lateral periphery of the capacitor main body so that the second dielectric layer is enclosed in the first dielectric layer.

18. A capacitor-equipped circuit substrate assembly according to claim 15, wherein the thermal expansion coefficient of the first dielectric layer is less than 10 ppm/° C. and the thermal expansion coefficient of the second dielectric layer is 10 ppm/° C. or more.

19. A capacitor-equipped circuit substrate assembly according to claim 15, wherein the dielectric constant of the first dielectric layer is less than 15 and the dielectric constant of the second dielectric layer is 15 or more.

20. A capacitor-equipped circuit substrate assembly according to claim 15, wherein the first dielectric layer has a Young's modulus of 200 GPa or higher.

21. A capacitor-equipped circuit substrate assembly according to claim 15, wherein the first dielectric layer has a Young's modulus of 300 GPa or higher.

22. An electronic unit comprising:
   a capacitor main body having a front surface on which a semiconductor device is to be mounted and a rear surface at which the capacitor main body is to be mounted on a first main surface of a wiring substrate, a plurality of internal electrodes disposed inside the capacitor main body, and a plurality of via conductors penetrating the capacitor main body between the front surface and the rear surface and electrically connected to the internal electrodes, wherein the capacitor main body has a first dielectric layer located on a side of the capacitor main body closer to the front surface and a second dielectric layer located on a side of the first dielectric layer closer to the rear surface, the second dielectric layer having a higher thermal expansion coefficient and a higher dielectric constant than the first dielectric layer;
   a semiconductor device mounted on a front surface of the capacitor and having at a bottom surface thereof a plurality of connecting terminals; and
   a circuit substrate having a first main surface on which the capacitor is mounted and a second main surface, wherein at least the first main surface and the second main surface are formed by insulating resin layers.

23. An electronic unit according to claim 22, wherein the capacitor main body further comprises a first dielectric layer located on a side of the capacitor main body closer to the rear surface, the second dielectric layer being located between the first dielectric layers.

24. An electronic unit according to claim 22, wherein the first dielectric layer comprises portions located at a front surface side, a rear surface side and a lateral periphery of the capacitor main body so that the second dielectric layer is enclosed in the first dielectric layer.

25. An electronic unit according to claim 22, wherein the thermal expansion coefficient of the first dielectric layer is less than 10 ppm/° C. and the thermal expansion coefficient of the second dielectric layer is 10 ppm/° C. or more.

26. An electronic unit according to claim 22, wherein the dielectric constant of the first dielectric layer is less than 15 and the dielectric constant of the second dielectric layer is 15 or more.

27. An electronic unit according to claim 22, wherein the first dielectric layer has a Young's modulus of 200 GPa or higher.

28. An electronic unit according to claim 22, wherein the first dielectric layer has a Young's modulus of 300 GPa or higher.

* * * * *